US008835263B2

(12) United States Patent
Weijtmans et al.

(10) Patent No.: US 8,835,263 B2
(45) Date of Patent: Sep. 16, 2014

(54) FORMATION OF A SELECTIVE CARBON-DOPED EPITAXIAL CAP LAYER ON SELECTIVE EPITAXIAL SIGE

(75) Inventors: Johan Weijtmans, Richardson, TX (US); Jiong-Ping Lu, Overijse (BE); Rick Wise, Fairview, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1953 days.

(21) Appl. No.: 11/677,496

(22) Filed: Feb. 21, 2007

(65) Prior Publication Data

US 2008/0199999 A1 Aug. 21, 2008

(51) Int. Cl.
*H01L 21/336* (2006.01)
*H01L 29/78* (2006.01)
*H01L 29/165* (2006.01)
*H01L 29/66* (2006.01)
*H01L 21/8238* (2006.01)

(52) U.S. Cl.
CPC ......... *H01L 29/7834* (2013.01); *H01L 29/6656* (2013.01); *H01L 29/7848* (2013.01); *H01L 21/823814* (2013.01); *H01L 29/66636* (2013.01); *H01L 21/823807* (2013.01); *H01L 29/665* (2013.01); *H01L 29/66545* (2013.01); *H01L 29/165* (2013.01)
USPC ...... 438/285; 438/44; 438/300; 257/E21.398; 257/E21.409

(58) Field of Classification Search
CPC ............ H01L 29/7834; H01L 29/66636; H01L 29/7848
USPC ............ 438/44, 222, 285, 300, 341, 481; 257/E21.398, E21.409
See application file for complete search history.

(56) References Cited

U.S. PATENT DOCUMENTS

| 5,281,552 | A | 1/1994 | King et al. |
| 6,905,542 | B2 | 6/2005 | Samoilov et al. |
| 7,122,449 | B2 * | 10/2006 | Langdo et al. ................ 438/481 |
| 7,166,528 | B2 * | 1/2007 | Kim et al. ...................... 438/607 |
| 7,268,362 | B2 * | 9/2007 | Wang et al. ...................... 257/20 |
| 7,390,729 | B2 * | 6/2008 | Hsieh et al. ................... 438/583 |
| 7,504,301 | B2 * | 3/2009 | Waite et al. ................... 438/255 |
| 2002/0109178 | A1 * | 8/2002 | McMillan et al. ............ 257/306 |

OTHER PUBLICATIONS

Nakatsuka et al., "Ni-Silicide/Si and SiGe(C) Contact Technology for ULSI Applications", 14th International Conference on Advanced Thermal Processing of Semiconductors—RTP2006, Oct. 2006, entire document especially p. 31, para 2; p. 34, para 2; p. 67, para 1; p. 37.

Ghani et al., "A 90nm High Volume Manufacturing Logic Technology Featuring Novel 45nm Gate Lenght Strained Silicon CMOS Transistors", 2003 IEEE International Electron Devices Meeting (IEDM), Dec. 10, 2003, entire document especially Abstract.

\* cited by examiner

*Primary Examiner* — Colleen A Matthews
*Assistant Examiner* — Colleen E Snow
(74) *Attorney, Agent, or Firm* — Rose Alyssa Keagy; Frederick J. Telecky, Jr.

(57) ABSTRACT

A method for forming epitaxial SiGe of a PMOS transistor. In an example embodiment, the method may include providing a semiconductor wafer having a PMOS transistor gate stack, extension sidewalls, source/drain extension regions, and active regions. The method may also include performing a recess etch of the active regions and forming epitaxial SiGe within the recessed active regions by forming a selective epi SiGe region coupled to the surface of the recessed active regions and a selective carbon-doped epitaxial cap layer coupled to the selective epi SiGe region.

17 Claims, 6 Drawing Sheets

FORMATION OF A SELECTIVE CARBON-DOPED EPITAXIAL CAP LAYER ON SELECTIVE EPITAXIAL SIGE

BACKGROUND OF THE INVENTION

This invention relates to a method of forming epitaxial SiGe in PMOS transistors.

DETAILED DESCRIPTION OF THE INVENTION

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
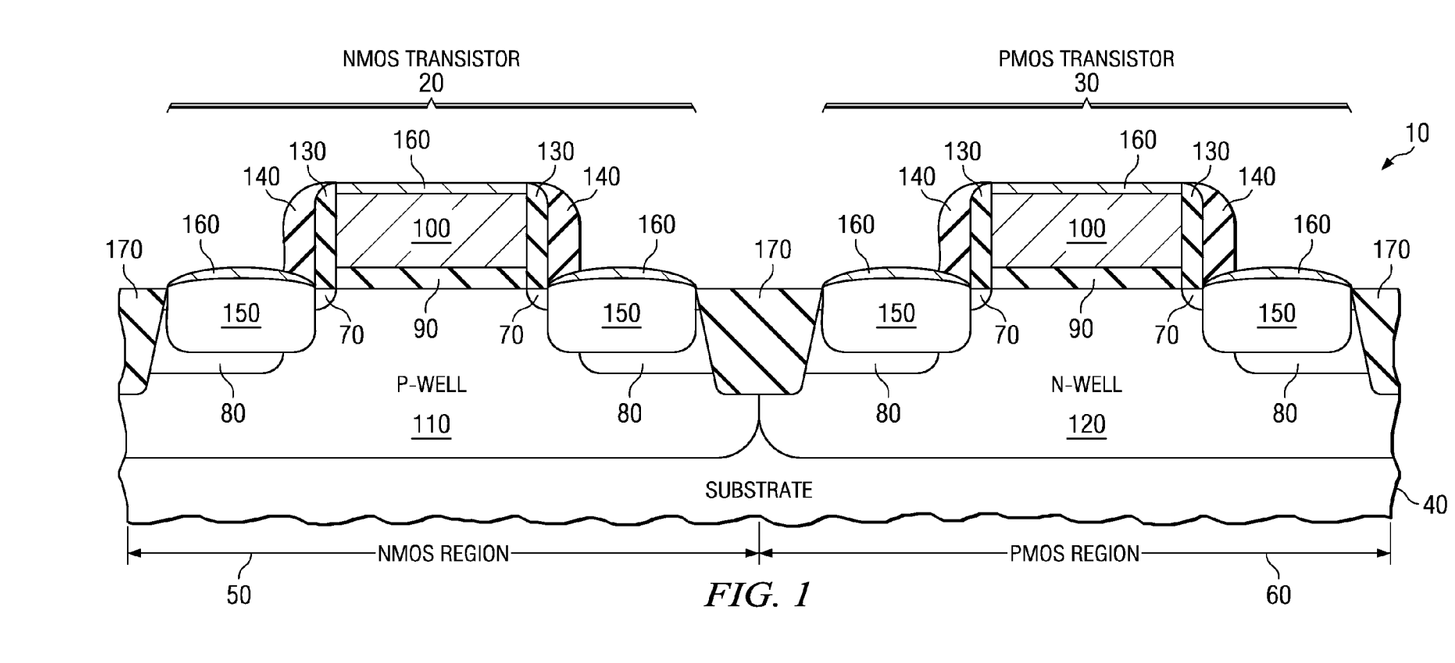
FIG. 1 is a cross-sectional view of a partially fabricated semiconductor wafer.

Referring to the drawings, FIG. 1 is a cross-sectional view of a partially fabricated semiconductor wafer 10. In the example application, CMOS transistors 20, 30 are formed within a semiconductor substrate 40 having an NMOS region 50 and a PMOS region 60. The CMOS transistors 20, 30 are electrically insulated from other active devices (not shown) by shallow trench isolation structures 170 formed within the NMOS and PMOS regions 50, 60; however, any conventional isolation structure may be used such as field oxide regions (also known as "LOCOS" regions) or implanted isolation regions. The semiconductor substrate 40 is a single-crystalline substrate that is doped to be n-type and p-type; however, it may be a different material such as GaAs and InP and it may have additional layers.

Transistors, such as CMOS transistors 20, 30, are generally comprised of a gate, source, and drain. More specifically, as shown in FIG. 1, the active portion of the transistors are comprised of source/drain extension regions 70, source and drain regions 80, and a gate stack that is comprised of a gate oxide 90 and a gate polysilicon electrode 100. The CMOS transistors 20, 30 also have a channel region that is located directly below the gate oxide 90 within the p-well 110 or the n-well 120.

The example NMOS transistor 20 is an n-channel MOS transistor. Therefore it is formed within a p-well region 110 of the semiconductor substrate 40. In addition, the source and drain regions 80 as well as the source/drain extension regions 70 (which may be lightly doped ("LDD"), medium doped ("MDD"), or highly doped ("HDD")) have n-type dopants. The NMOS transistor gate is created from an n-type doped polysilicon electrode 100 and a gate oxide dielectric 90. However, it is within the scope of the invention for the NMOS transistor to have a metal gate instead of a polysilicon gate. For instance, the alternative metal gate electrode 100 may be a fully silicided ("FUSI") polysilicon electrode that is comprised of any commonly used metal such as Ti, Ta, Ir, Mo, or any combinations thereof—including their molecules and complexes.

Similarly, the example PMOS transistor 30 is a p-channel MOS transistor. Therefore it is formed within an n-well region 120 of the semiconductor substrate 40. In addition, the source and drain regions 80 as well as the source/drain extension regions 70 have p-type dopants. The PMOS transistor gate is created from a p-type doped polysilicon electrode 100 and a gate oxide dielectric 90. However, it is within the scope of the invention for the PMOS transistor to have a metal gate electrode 100, as discussed supra.

A sidewall spacer structure comprising offset layers 130/140 may be used during semiconductor fabrication to enable the proper placement of the source/drain extension regions 70, the epi SiGe regions 150, and the source/drain regions 80. The source/drain extension regions 70 are formed using the gate stack 90, 100 and the extension sidewalls 130 as a mask. Similarly, the source/drain regions 80 are formed using the gate stack 90, 100 and the source/drain sidewalls 140 as a mask. It is to be noted that the source/drain extension anneal and source/drain anneal will likely cause a lateral migration of the source/drain extension regions 70 and source/drain regions 80 toward the channel region of the transistor.

The gate stack 90, 100 and the extension sidewalls 130 of the PMOS transistors 30 are also used as a mask to form the source/drain epitaxial SiGe regions 150 (also called "embedded SiGe source/drain", "epitaxial SiGe", or "epi SiGe"). The epi SiGe regions 150 may improve transistor performance by increasing the mobility of the carriers in the channel of the PMOS transistors 30 that result from the intentionally created lattice mismatch that induces mechanical stress or strain across the channel region. Specifically, a compressively-strained channel typically provides an improved hole mobility that is beneficial for PMOS transistors 30 by increasing the PMOS drive current.

The PMOS transistors 30 also have a silicide layer 160 overlying the epi SiGe 150 and the polysilicon gate electrode 100. The silicide layer 160 facilitates an improved electrical connection between the epi SiGe 150 and the transistor's metal contacts (not shown). Preferably, the silicide layer 160 contains nickel ("Ni") or a combination of nickel and platinum ("Pt"). However, it is within the scope of the invention to use any suitable material—or combination of materials—within the silicide layer, such as cobalt ("Co"), titanium ("Ti"), palladium ("Pd"), or iridium ("Ir").

In the example application, the epi SiGe 150 initially has a selective epi SiGe region and a selective carbon-doped epitaxial cap layer (hereinafter called "selective C-doped epi cap layer") discussed further infra. The selective carbon-doped epitaxial cap layer facilitates the thermal stability of the subsequently formed silicide layer 160 (by inhibiting Ge precipitation and film agglomeration during the silicidation process).

Subsequent fabrication (not shown) will create the remainder of the 'front-end' portion and the 'back-end' portion of the integrated circuit. The remaining front-end portion generally contains metal contacts that electrically connect the CMOS transistors 20, 30 to other active or passive devices (not shown) that are located throughout the semiconductor wafer 10. The front-end also generally contains an insulative dielectric layer that electrically insulates the metal contacts. The back-end generally contains one or more interconnect layers (and possibly one or more via layers) that properly route electrical signals and power through out the electrical devices of the completed integrated circuit.

Referring again to the drawings, FIGS. 2A-2J are cross-sectional views of a partially fabricated semiconductor wafer that illustrate an example process for forming the PMOS transistor 30 of FIG. 1. It is within the scope of the invention to use this process to form other transistor devices that vary in some manner from the example PMOS transistor 30. For instance, the method may be used to fabricate PMOS transistors on alternative substrates such as silicon-on-insulator ("SOI").

Figure 2A:
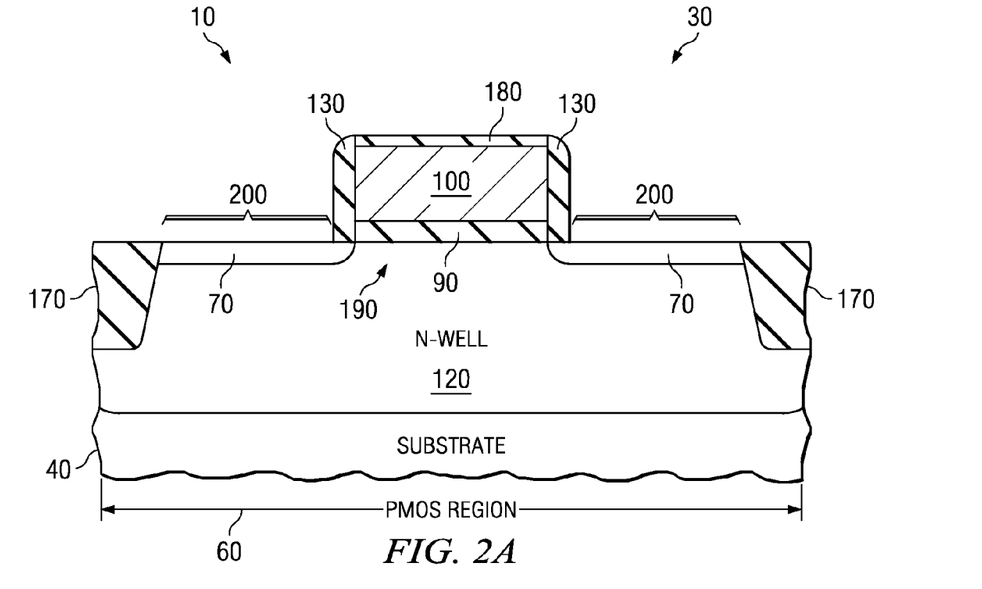
FIGS. 2A-2J are cross-sectional diagrams of a process for forming a semiconductor wafer.

FIG. 2A is a cross-sectional view of the semiconductor wafer 10 after the formation of a portion of the PMOS transistor 30. Specifically, the semiconductor wafer 10 contains shallow trench isolation structures 170, the n-well 120 within the substrate 40, the gate stack 190 comprising the gate oxide 90 and the gate electrode 100, the extension sidewalls 130, and the source/drain extension regions 70. The exposed surface of the n-well 120 (i.e. the exposed surface of the source/drain extension regions 70) are the active regions 200 of the PMOS transistor 30. It is to be noted that the thickness of the extension sidewalls 130 may be adjusted to change the location of the subsequently formed epi SiGe regions 150 in order to obtain a targeted transistor performance that is determined by the amount of source/drain extension regions 70 that remain in the final PMOS structure. The fabrication processes used to form the semiconductor wafer 10 shown in FIG. 2A are those that are standard in the industry, such as the fabrication process described in the commonly assigned U.S. Pat. No. 7,514,309, issued Apr. 7, 2009 (Ser. No. 11/184,337, filed Jul. 19, 2005), incorporated herein by reference and not admitted to be prior art with respect to the present invention by its mention in this section.

In the example application, all of the gate electrodes have the optional gate hardmask 180 comprised of $SiO_2$, SiN, SiON, or a combination thereof (as described further in the incorporated reference). If used, the gate hardmask 180 may protect the gate electrodes 100 from undesired etching and epitaxial formation during the processes shown in FIGS. 2B-2D and described infra.

It is within the scope of the embodiment to also form halo implant regions within the n-well 120 (not shown). The optional halo implants (sometimes called "pocket implants" or "punch through stoppers" because of their ability to stop punch through current) may be formed with any standard implant or diffusion process within—or proximate to—the channel, the extension regions, or the source/drain regions.

Figure 2B:
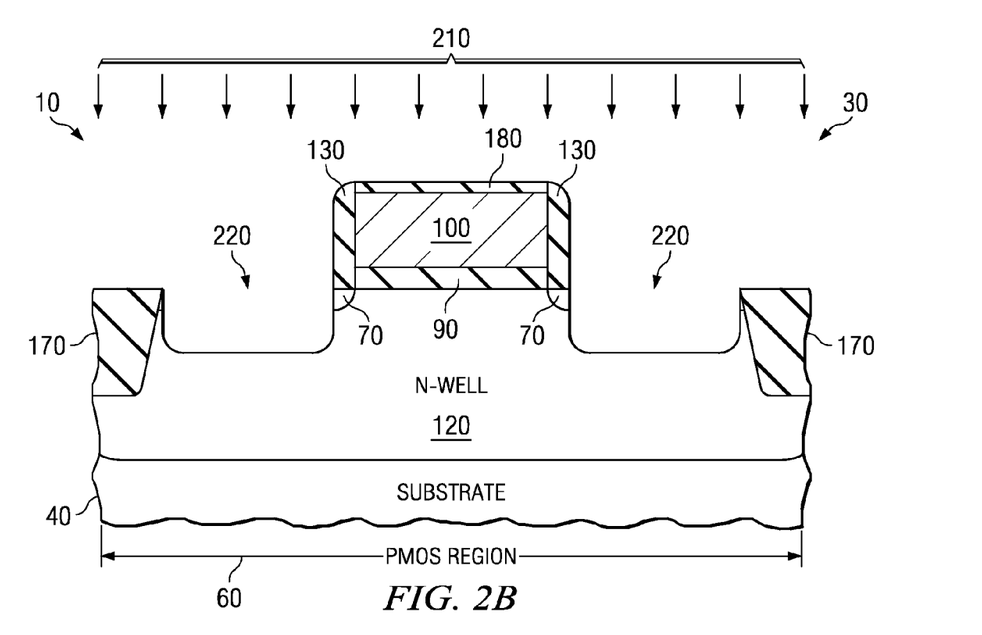
Figure 2C:
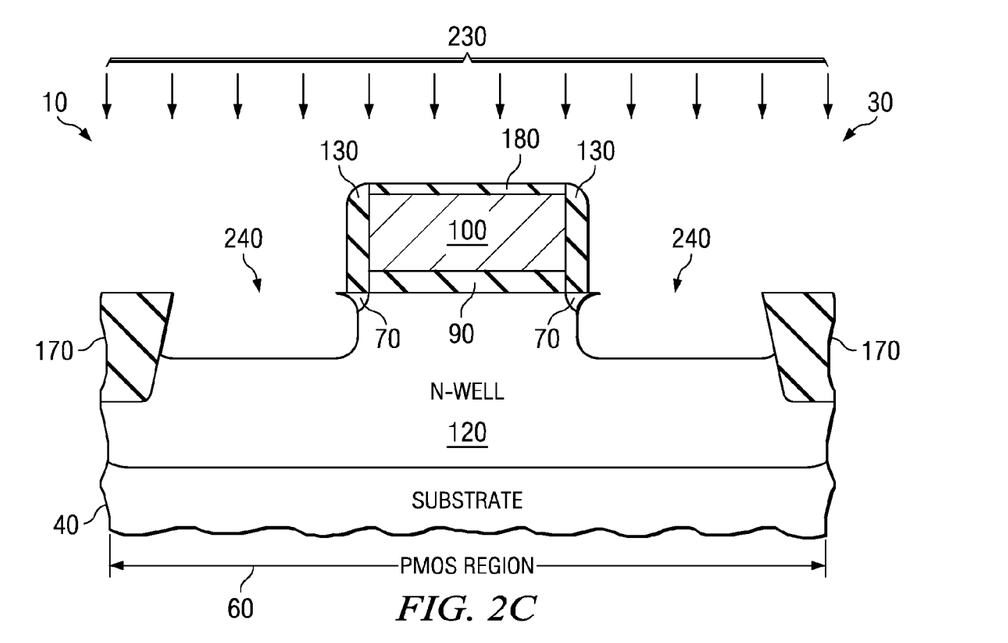

The next step is the recess etch 210 of the active regions 200 of the PMOS transistor 30, as shown in FIG. 2B. Preferably, the recess etch 210 is a standard anisotropic etch of the active regions 200; therefore, a maximum amount of previously formed doped extension regions 70 remains after the formation of the recessed active regions 220. However, it is within the scope of the example embodiment to perform a recess etch 230 using a combination of anisotropic and isotropic etches, or using an isotropic etch only, as shown in FIG. 2C. An isotropic etch 230 will generally undercut the extension sidewalls 130, thereby creating recessed active regions 240 that encroach closer to the channel region and remove more material in the extension regions 70 (resulting in a corresponding change in the dosing level of those extension regions 70).

It is within the scope of the invention to etch the recessed active regions 220 to any suitable depth. In the example application, the recessed active regions 220 are etched to a depth between 100-1200 Å, which is greater than the depth of the source/drain extension regions 70 and approximately the same depth as the subsequently formed source and drain regions 80 (see FIG. 1).

The recess etch 210 is "selective" to the gate hardmask 180. Therefore, the gate hardmask 180 protects the gate electrode 100 of the PMOS transistor 30 from the recess etch 210. In addition, the gate hardmask 180 will protect the gate electrode 100 of the PMOS transistor 30 from forming epitaxial SiGe during the next fabrication steps.

The epi SiGe regions 150 are now formed over the recessed active regions 220 of the PMOS 60. The epi SiGe regions 150 are considered 'selective recessed strained source/drain epi SiGe regions' because the epitaxial layer 150 is comprised of SiGe and it is selectively deposited on the exposed active silicon substrate 40 within the recessed active regions 220; however, it is not deposited on any dielectric regions, such as the regions containing $SiO_2$ or $Si_3N_4$. Moreover, the epi SiGe 150 may be doped or undoped. For instance, in the example application the epi SiGe regions 150 are doped p-type with B.

It is within the scope of the embodiment to use any suitable process 250 to form the epi SiGe regions 150. For example, reduced-temperature chemical vapor deposition ("RTCVD"), ultra-high vacuum chemical vapor deposition ("UHCVD"), molecular beam epitaxy ("MBE"), or a small or large batch furnace-based process may be used.

Figure 2D:
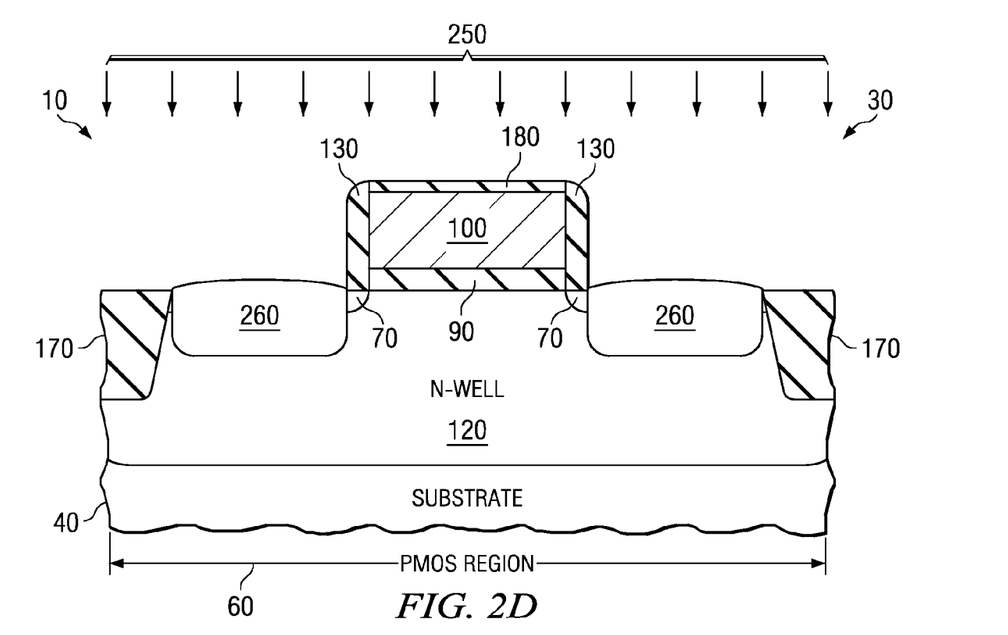

In the example application, a RTCVD process 250 is used initially to fill the recessed active regions 220 (or 240) with epitaxial SiGe, thereby forming the selectively deposited epi SiGe 260, as shown in FIG. 2D. The example RTCVD process uses a temperature range of 450-800° C. and a pressure between 1-100 T. In addition, the RTCVD process uses a silicon-bearing precursor DCS (dichlorosilane), a germanium-bearing precursor $GeH_4$ (germane), and a p-doping precursor $B_2H_6$ (diborane). Process selectivity is achieved by including HCl (hydrochloric acid) and the carrier gas $H_2$ (hydrogen). Once formed, the composition of the selective epi SiGe 260 will be B-doped $Si_{(1-x)}Ge_x$.

As shown in FIG. 2D, the RTCVD process 250 creates a slight rise in the top surface of the selective epi SiGe regions 260 above the top surface of the active regions 200. Therefore, the RTCVD process 250 not only back-fills the recessed active regions 220 (or 240), it also continues to grow the selective epi SiGe 260 to a height somewhere above the surface of the substrate 40. Growing the selective epi regions 260 thicker than the depth of the recessed active regions 220 (or 240) can mitigate the impact of the loss of epitaxial SiGe during the hardmask removal and silicidation processes described infra.

Figure 2E:
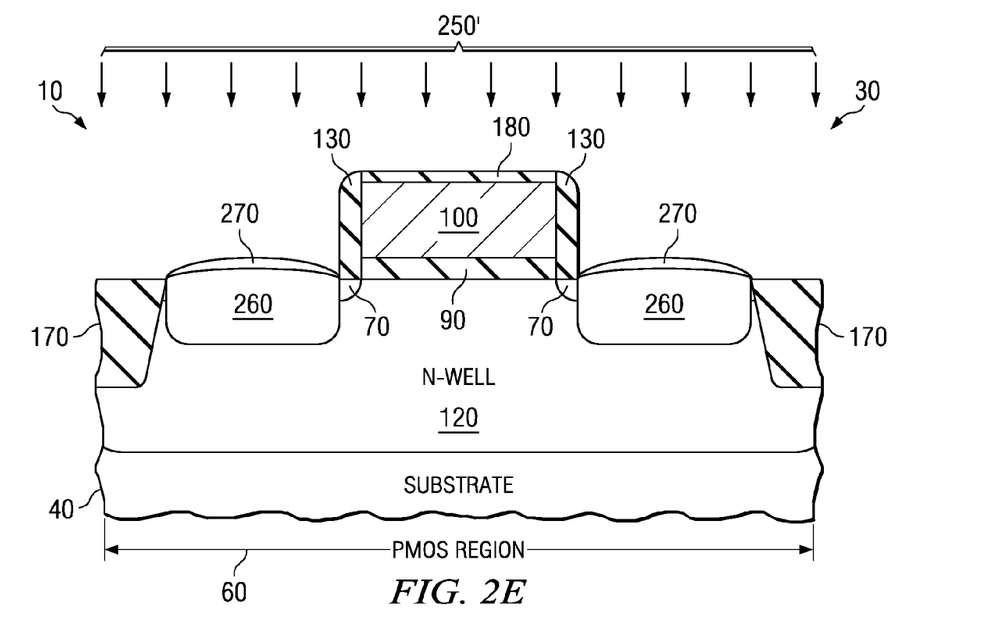

Next, as shown in FIG. 2E, the RTCVD process 250 is now modified to form a selective C-doped epi cap layer 270 over the selective epi SiGe 150. The example RTCVD process 250' is performed in-situ following the RTCVD process 250 (i.e. without interrupting the deposition process or removing the semiconductor wafer 10 from the deposition chamber). The RTCVD process 250' also uses most of the parameters of the prior RTCVD process 250; namely, a temperature range of 450-800° C., a pressure between 1-100 T, the silicon-bearing precursor DCS, the germanium-bearing precursor $GeH_4$, and the p-doping precursor $B_2H_6$. (Similarly, process selectivity is achieved by including HCl and the carrier gas $H_2$.) However, the example RTCVD process 250' adds a carbon-bearing precursor $SiH_3CH_3$ (methylsilane). The addition of the carbon-doped gas causes a selective C-doped epi cap layer 270 to form during the last portion of the deposition process. Once formed, the composition of selective C-doped epi cap layer 270 will be B-doped $Si_{(1-x)}Ge_xC$. The selective C-doped epi cap layer 270 may be any suitable thickness, such as 40-120 Å. Moreover, it is within the scope of the invention to turn off the germanium-bearing precursor during the formation of the selective C-doped epi cap layer 270, thereby creating a selective C-doped epi cap layer 270 comprised of Si:C or B-doped Si:C.

However, it is also within the scope of the invention to create a graded C profile within the selective C-doped epi cap layer 270 by changing the concentration of the carbon-bearing precursor $SiH_3CH_3$ during the RTCVD process 250'. For example, increasing the concentration of C from the bottom surface of the selective C-doped epi cap layer 270 (i.e. the surface closest to the selective epi SiGe 260) to the top surface of the selective C-doped epi cap layer 270 may help to protect the selective epi SiGe 260 from unwanted strain compensation (due to the smaller atomic size of C, which offsets some of the benefit of having the Ge atoms create advantageous strain in the source/drain regions).

Figure 2F:
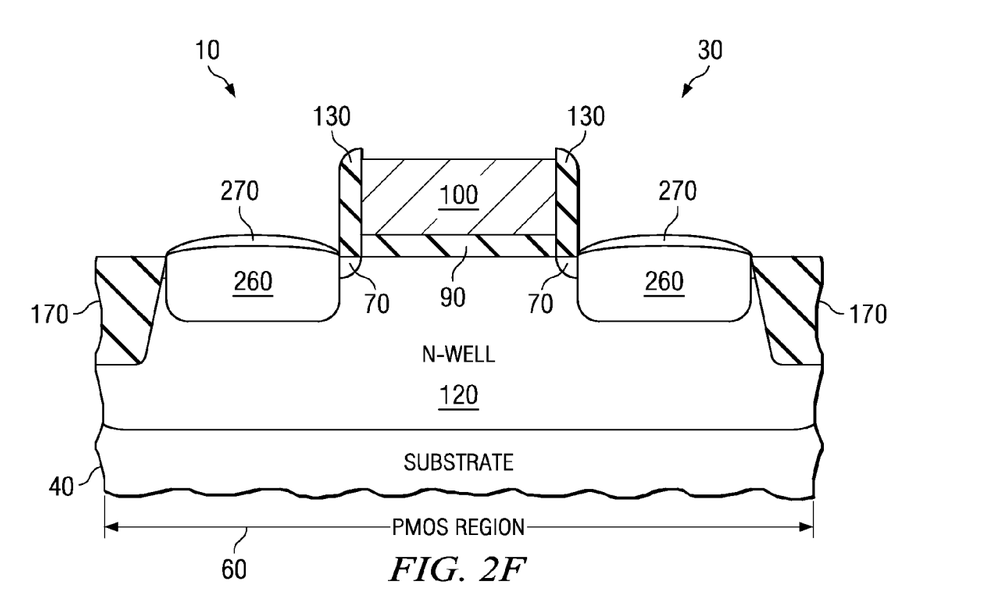

The gate hardmask 180 is now removed, as shown in FIG. 2F. Any standard process may be used to strip the gate hardmask 180. For example, if the gate hardmask 180 is SiN then it may be removed with a hot phosphoric acid strip.

The fabrication of the integrated circuit now continues with standard manufacturing steps. Generally, the next steps are the formation of source/drain sidewalls 140, the creation of the source/drain regions 80, and then the formation of the silicide layer 160, as shown in FIGS. 2G-2J.

Figure 2G:
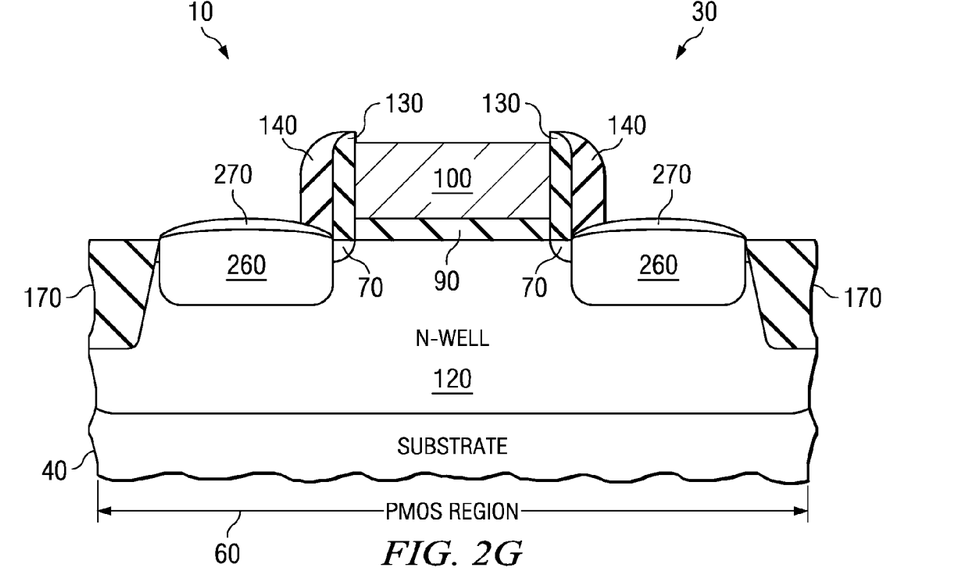

Referring to FIG. 2G, source/drain sidewalls 140 are formed proximate to the extension sidewalls 130 using any standard material and process. For example, the source/drain sidewalls 140 may be comprised of an oxide layer and a nitride layer that are formed with a CVD process and then subsequently anisotropically etched. However, the source/drain sidewalls 140 may contain more layers (i.e. a spacer oxide layer, a silicon nitride layer, and a final oxide layer) or less layers (i.e. only an oxide layer or a nitride layer).

Figure 2H:
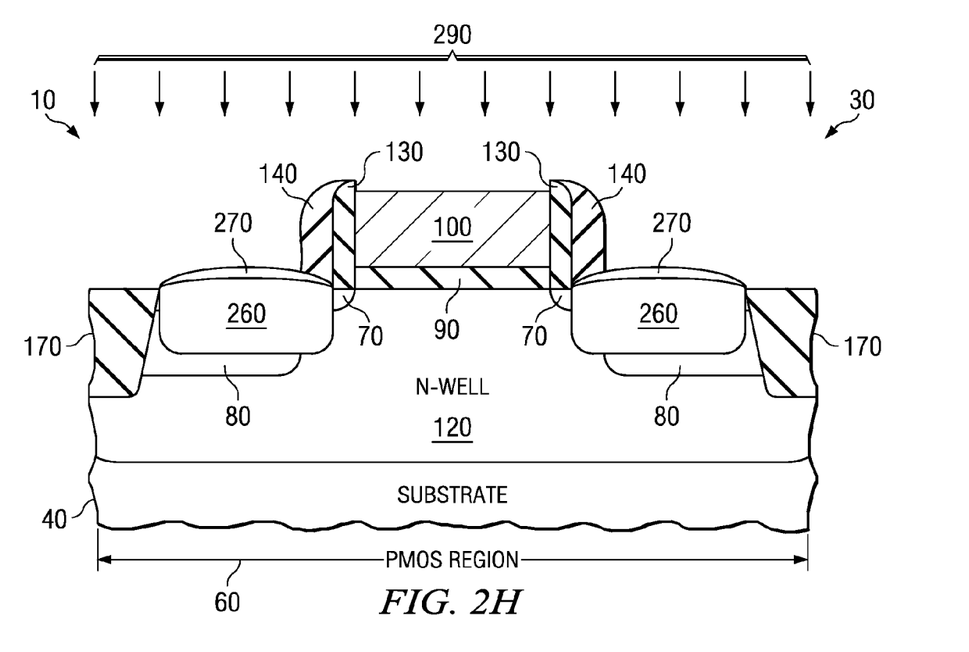

Now, as shown in FIG. 2H, the source/drain sidewalls 140 are used as a template for the source/drain implantation step. The source and drain regions 80 may be formed through any one of a variety of processes 290, such as deep ion implantation or deep diffusion. The dopants used to create the source and drain regions 80 for a PMOS transistor are typically boron; however, other dopants or combinations of dopants may be used. The implantation of the dopants is generally self-aligned with respect to the outer edges of the source/drain sidewalls 140. (However, it is to be noted that due to lateral straggling of the implanted species, the source and drain regions 80 may begin slightly inside the outer corner of the source/drain sidewalls 140.)

In the example application, the source and drain regions 80 are now activated by an anneal step. This anneal step acts to repair the damage to the semiconductor wafer and to activate the dopants. The activation anneal may be performed by any technique such as rapid thermal anneal ("RTA"), flash lamp annealing ("FLA"), or laser annealing.

Generally, the next step in the manufacturing process is the silicide loop. The purpose of the silicide loop is the creation of silicide 160 on active silicon surfaces (such as the epitaxial SiGe 150 and the polysilicon gate electrode 100, as shown in FIG. 1). It is to be noted that in applications where the gate electrode 100 is a metal gate electrode, the hardmask 180 would probably be left on the metal gate electrode 100 until the end of the silicidation process.

Figure 2I:
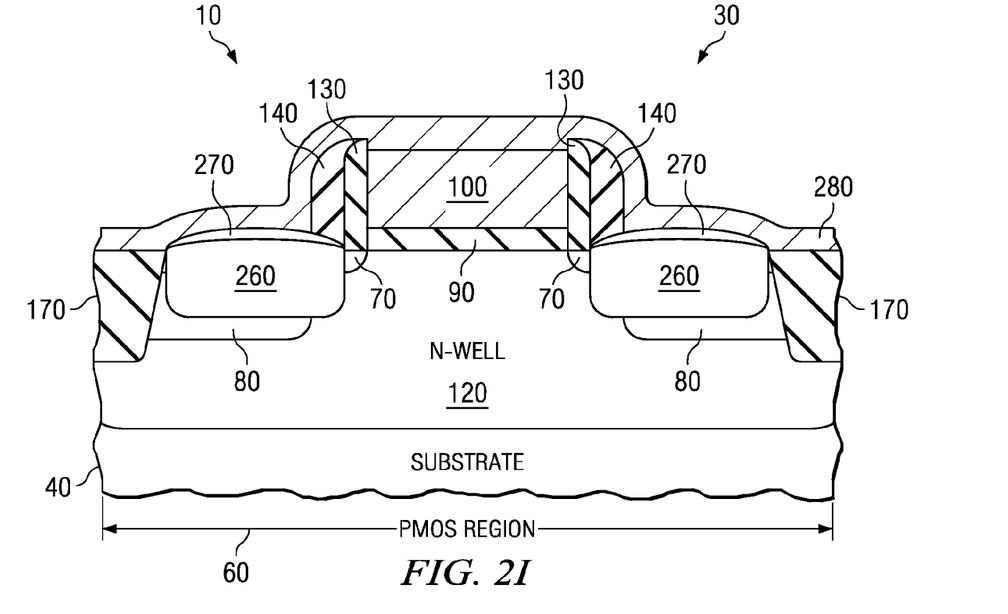

Referring now to FIG. 2I, the first step of the silicide loop is the deposition of a metal interface layer 280 over the top surface of the semiconductor substrate 40. The interface layer 280 is preferably comprised of Ni; however, other suitable materials such as NiPt, Pt, Co, Ti, Pd, or Ir may be used. In the example application, the interface layer 280 is 50-150 Å thick in order to consume a majority of the selective C-doped epi cap layer 270 within the final silicide structures 160. (Note that every 1.0 nm of Ni consumes approximately 0.82 nm of Si.)

An optional capping layer (not shown) may also be formed over the interface layer 280. If used, the capping layer acts as a passivation layer that prevents the diffusion of oxygen from ambient into the interface layer 280. The optional capping layer may be any suitable material, such as Ti or TiN.

The second step of the silicide loop is an anneal. The semiconductor wafer 10 may be annealed with any suitable process, such as RTA. This anneal process will cause the interface layer 280 to consume most or all of the selective C-doped epi cap layer 270, thereby creating the final epi SiGe structure 150 and forming a silicide 160 (i.e. a nickel-germano-carbo-silicide or a nickel-carbo-silicide) over the epi SiGe 150. Therefore the final epi SiGe structure 150 may comprise a majority of the selective epi SiGe 260 or all of the selective epi SiGe 260 plus a relatively small portion of the selective C-doped epi cap 270 that wasn't consumed within the suicide 160.

Figure 2J:
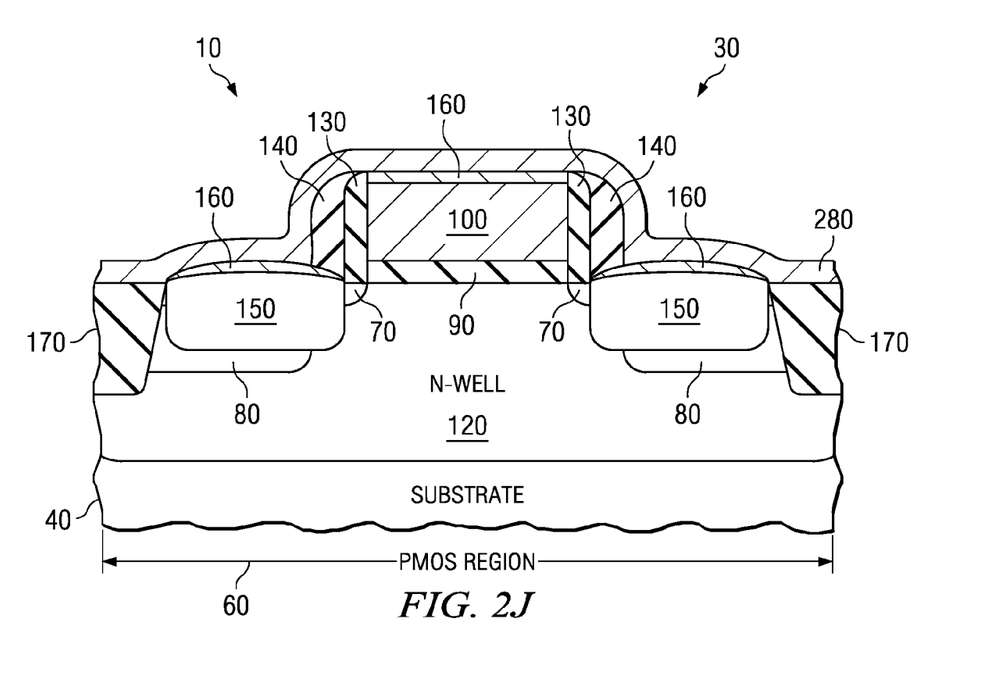

The anneal process will also form a nickel-silicide layer 160 on the surface of the gate electrode 100 in the example application (where the gate electrode 100 is polysilicon). These source/drain and gate silicide regions 160 are shown in FIG. 2J. It is to be noted that the selective carbon-doped cap layer 270 (which is now mostly consumed) has improved the structural integrity of the silicide layer 160 formed on the epi SiGe 150. This more stable silicide layer 160 will provide a lower resistance conduction path between the (subsequently formed) metal contacts and the source/drain regions 80/150.

The third step in the silicide loop is the removal of the un-reacted metal interface layer 280, resulting in the semiconductor wafer 10 shown in FIG. 1. The un-reacted portion of the interface layer 280 (and the capping layer, if used) is removed using any suitable process such as a wet etch process (i.e. using a fluid mixture of sulfuric acid, hydrogen peroxide, and water).

The fourth step of the silicide loop is a second anneal (such as another RTA) to further react the silicide 160 that has been previously created. If the initial anneal process (i.e. the second step) of the silicide loop did not complete the silicidation process then this second anneal (i.e. the fourth step of the silicide loop) will ensure the formation of a nickel germano-silicide $NiGe_xSi_{1-x}$ 160—which will lower the sheet resistance of silicide 160.

The fabrication of the final integrated circuit continues with standard fabrication processes to complete of the front-end structure and the back-end structure. The front-end fabrication process includes the formation of the pre-metal dielectric layer and the creation of the metal contacts (within the dielectric layer) that are connected to the source and drain 80/150 or the gate electrode 100. The back-end fabrication includes the formation of metal vias and interconnects. Once the fabrication process is complete, the integrated circuit will be tested and packaged.

In an alternative application, the example RTCVD process 250' (FIG. 2E) includes the discontinuance of the germanium-bearing precursor gas $GeH_4$ when the carbon-bearing precursor gas $SiH_3CH_3$ (methylsilane) is added to form the selective C-doped epi cap layer 270. This alternative RTCVD process 250' will form a selective C-doped epi cap layer 270 having a (B-doped) Si:C composition. In addition, the alternative selective C-doped epi Si:C cap layer 270 is any suitable thickness such as 40-120 Å. Furthermore, the C-doped epi Si:C cap layer 270 may have a graded C profile by changing the concentration of the carbon-bearing precursor SiH₃CH₃ during the RTCVD process 250'. For example, increasing the concentration of C between the bottom surface of the selective C-doped epi cap Si:C layer 270 and the top surface of the C-doped epi cap Si:C layer 270 may protect the selective epi SiGe regions 260 from unwanted strain compensation due to the smaller atomic size of C (which offsets some of the benefit of incorporating Ge in the source/drain region). Moreover, in this alternative application, the silicide 160 that is subsequently formed during the silicide loop (discussed supra) will contain only a small amount of Ge, which will diffuse out during subsequent processing unless the silicidation process consumes more than the thickness of the Si:C 270.

Various additional modifications to the invention as described above are within the scope of the claimed invention. For example, instead of using the carbon-bearing precursor SiH₃CH₃ (methylsilane) to form the C-doped epi cap layer 270, other suitable carbon-bearing precursors, such as SiH₂(CH₃)₂ (dimethylsilane) or SiH(CH₃)₃ (trimethylsilane) may be used. In addition, the flow of the source gases during the epi process may be controlled to alter the composition of the strain or stress producing material comprising the epi SiGe 150. Furthermore, the source/drain dopants may be implanted before, after, or during the formation of the epi SiGe regions 150.

Moreover, the selective C-doped epi cap layer 270 may be performed ex-situ instead of in-situ. For example, one process chamber (or tool) may be used for the SiGe deposition and then another process chamber (or tool) may be used for the Si:C cap layer deposition in order to keep the background levels of C very low during the deposition of SiGe and also keep the background levels of Ge very low during the deposition of SiC.

Furthermore, an additional anneal process may be performed after any step in the above-described fabrication process. When used, an anneal process can improve the microstructure of materials and thereby improve the quality of the semiconductor structure. In addition, higher anneal temperatures may be used in order to accommodate transistors having thicker polysilicon gate electrodes. Lastly, the use of alternative anneal processes are within the scope of the invention, such as flash lamp annealing ("FLA") or laser annealing.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method for forming epitaxial SiGe of a PMOS transistor in a semiconductor wafer, comprising:
providing said semiconductor wafer having a PMOS transistor gate stack, extension sidewalls, source/drain extension regions, and active regions;
performing a recess etch of said active regions; and
forming said epitaxial SiGe within said recessed active regions by forming a selective epi SiGe region coupled to a surface of said recessed active regions and a selective carbon-doped epi cap layer located over said selective epi SiGe region.

2. The method of claim 1 further comprising the step of forming a silicide layer over said epitaxial SiGe.

3. The method of claim 2 wherein said step of forming a silicide layer involves the consumption of a majority of said selective carbon-doped epitaxial cap layer into said silicide layer.

4. The method of claim 2 wherein said silicide layer contains Ni.

5. The method of claim 2 wherein said silicide layer contains Ni and Pt.

6. The method of claim 1 wherein said selective carbon-doped epitaxial cap layer has a graded carbon concentration.

7. The method of claim 1 wherein said selective carbon-doped epitaxial cap layer comprises Si:C.

8. The method of claim 1 wherein said selective carbon-doped epitaxial cap layer comprises $Si_{(1-x)}Ge_x$:C.

9. The method of claim 1 wherein said selective carbon-doped epitaxial cap layer comprises Si:C doped with B.

10. The method of claim 1 wherein said selective carbon-doped epitaxial cap layer comprises $Si_{(1-x)}Ge_x$:C doped with B.

11. The method of claim 1 wherein said selective carbon-doped epitaxial cap layer has a thickness between 40-120 Å.

12. The method of claim 1 wherein said selective epi SiGe region is comprised of SiGe doped with B.

13. The method of claim 1 wherein said PMOS transistor gate stack has a polysilicon gate electrode.

14. The method of claim 1 wherein said PMOS transistor gate stack has a metal gate electrode.

15. The method of claim 1 wherein said recess etch is performed to a depth greater than the depth of said source/drain extension regions.

16. The method of claim 1 wherein said step of forming said selective epi SiGe region comprises a RTCVD process.

17. The method of claim 1 wherein said step of forming said selective carbon-doped epi cap layer comprises a RTCVD process.

* * * * *